US005673282A

United States Patent [19]
Wurst

[11] Patent Number: 5,673,282
[45] Date of Patent: Sep. 30, 1997

[54] METHOD AND APPARATUS FOR MONITORING PERFORMANCE OF A LASER TRANSMITTER

[75] Inventor: William C. Wurst, Amherst, N.H.

[73] Assignee: Lucent Technologies Inc., Murray Hill, N.J.

[21] Appl. No.: 510,949

[22] Filed: Jul. 28, 1995

[51] Int. Cl.$^6$ .................................................. H01S 3/00
[52] U.S. Cl. .......................................... 372/38; 372/29
[58] Field of Search ................................ 372/38, 29, 33

[56] References Cited

U.S. PATENT DOCUMENTS

| Re. 31,969 | 8/1985 | Sell | 372/38 |
|---|---|---|---|
| 4,009,385 | 2/1977 | Sell | 250/199 |
| 4,677,632 | 6/1987 | Lisco et al. | 372/38 |
| 4,792,957 | 12/1988 | Kollanyi | 372/34 |
| 4,995,045 | 2/1991 | Burley et al. | 372/38 |
| 5,005,177 | 4/1991 | Beckwith | 372/38 |
| 5,285,457 | 2/1994 | Funakubo et al. | 372/34 |

*Primary Examiner*—Leon Scott, Jr.
*Attorney, Agent, or Firm*—Thomas Stafford

[57] ABSTRACT

A low-cost monitor includes two comparators which are adapted to form a window comparator which frames a laser transmitter's normal range of operation. An apparatus for generating an amplified back-face-monitor voltage corresponding to the laser transmitter's optical output power level is coupled to the window comparator. A reference voltage is also coupled to the window comparator which defines the upper threshold of the normal operational range. A controllable variable voltage source is coupled to the window comparator and is used to define the lower threshold of the normal operating range, where this lower threshold has two associated threshold values as described above. The lower threshold is initialized to the first threshold value which corresponds to an end-of-life operating state of the laser transmitter. When the back-face-monitor voltage signal equals or drops below the first threshold value, an alarm signal is generated by the laser monitor, and the controllable variable voltage source is switched to a second state for providing a second threshold value which corresponds to failed operating state of the laser transmitter. As the optical output power level continues to decline with temperature and time, it eventually falls belows the second threshold and a second alarm is generated to indicate failure of the laser. A variable gain instrumentation amplifier is coupled to the generating apparatus and utilized to measure the optical output power of the laser transmitter.

25 Claims, 3 Drawing Sheets

METHOD AND APPARATUS FOR MONITORING PERFORMANCE OF A LASER TRANSMITTER

TECHNICAL FIELD

This invention relates to laser monitoring. More particularly, this invention relates to a method and apparatus for monitoring the performance of a laser transmitter.

BACKGROUND OF THE INVENTION

Lasers are in widespread use in a wide variety of industrial, medical, consumer, and commercial applications due, in large part, to the development of inexpensive and generally reliable laser diodes. One important application for such laser diodes is in transmitters in modem high-speed digital optical communication systems that may be utilized, for example, to carry voice, data, and multimedia signals. In such applications, it is typically desirable that the transmitter operate such that its optical output power falls within a specified range. Unfortunately, optical output power of laser diodes can vary significantly with both temperature and time. Moreover, operation outside of the "normal" range can lead to transmission errors, degrade signal-to-noise ratio at the receiver, and negatively affect component and system reliability, among other serious consequences. Outright failure of the laser transmitter can cause undesirable communication service disruption and system downtime. To avoid such problems, the optical output of the laser transmitter is often monitored to determine whether the laser is functioning satisfactorily. Typically, the output power is monitored and the bias current of the laser diode simply adjusted as necessary to maintain a constant output power level. While such monitoring is satisfactory for many applications, it would be desirable if laser monitoring were enhanced to provide additional functionality and features in order to minimize the negative consequences of out-of-range operation or failure of the transmitter. It would further be desirable to provide such enhanced monitoring in a cost-effective manner.

SUMMARY OF THE INVENTION

Accordingly, the objects of the present invention are to measure optical output power of a laser, indicate whether the optical output power is within a prescribed range, and indicate that the laser is nearing the end of its useful life to facilitate preventative maintenance, in a cost-effective manner. These and other objects are satisfied, and the utility of monitoring is greatly enhanced, in accordance with the principles of the invention, by a novel method and apparatus adapted for setting a threshold to a first of at least two threshold values, the first of the threshold values representing a first output state of a laser, and a second of the threshold values representing a second output state of the laser; receiving an output signal indicative of the output of the laser; comparing a value of the output signal with the first threshold value; and, setting the threshold to the second threshold value when the value of the output signal is less than or equal to the first threshold value.

In an illustrative example of the invention, a low-cost monitor includes two comparators which are adapted to form a window comparator which frames a laser transmitter's normal range of operation. An apparatus for generating an amplified back-face-monitor voltage corresponding to the laser transmitter's optical output power level is coupled to the window comparator. A reference voltage is also coupled to the window comparator which defines the upper threshold of the normal operational range. A controllable variable voltage source is coupled to the window comparator and is used to define the lower threshold of the normal operating range, where this lower threshold has two associated threshold values as described above. The lower threshold is initialized to the first threshold value which corresponds to an end-of-life operating state of the laser transmitter. When the back-face-monitor voltage signal equals or drops below the first threshold value, a first alarm signal is generated by the laser monitor, and the controllable variable voltage source is switched to a second state for providing a second threshold value which corresponds to a failed operating state of the laser transmitter. As the optical output power level continues to decline with temperature and time, it eventually falls below the second threshold and a second alarm is generated to indicate failure of the laser. A variable gain instrumentation amplifier is coupled to the generating apparatus and utilized to measure the optical output power of the laser transmitter.

DETAILED DESCRIPTION OF THE INVENTION

Figure 1:
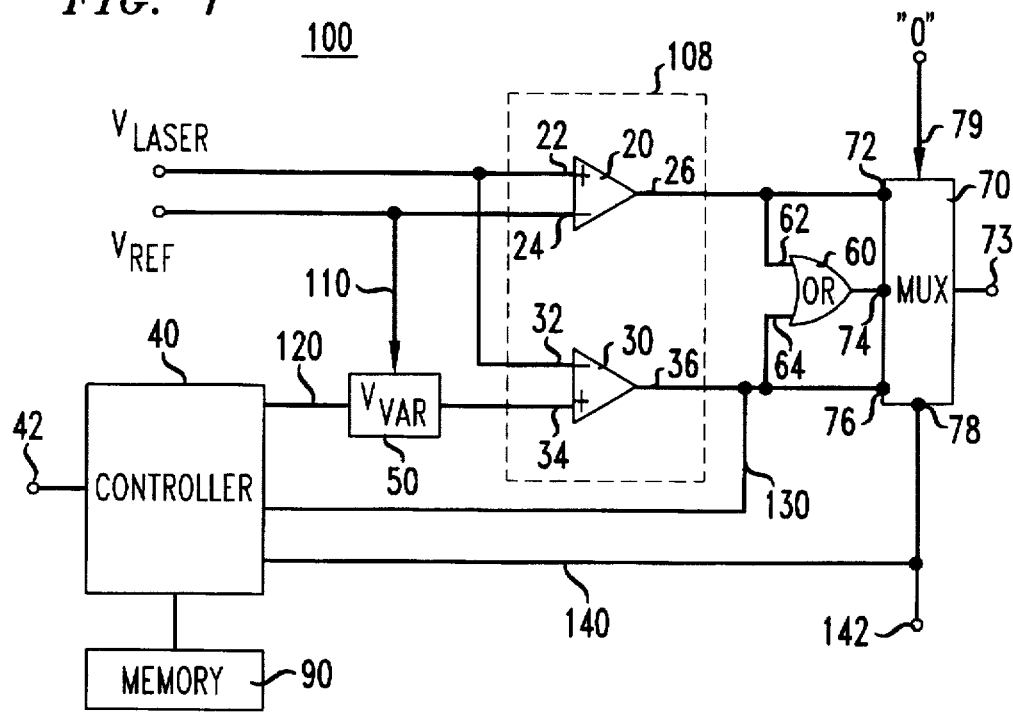
FIG. 1 is a simplified diagram of an illustrative example of a laser monitor, in accordance with the invention.

FIG. 1 is a simplified diagram of an illustrative example of a laser monitor 100, in accordance with the invention. Such a laser monitor may be used, for example, to monitor a laser transmitter (not shown) such as those that are typically used in optical communication systems. It may be desirable, in some applications of the invention to incorporate laser monitor 100 directly into a laser transmitter circuit card or circuit pack (not shown). It is emphasized that while this illustrative example deals with monitoring a laser transmitter that is used in communication systems, it is intended that the invention not be limited to transmitters or optical communication systems. The invention may be used, and the benefits of the invention realized, in any application where cost-effective laser monitoring is desired. Laser monitor 100, as shown, includes comparators 20 and 30, controller 40, variable voltage source 50, OR gate 60, and multiplexer 70. In this illustrative example of the invention, comparators 20 and 30 are operational amplifiers each having two input ports (including an inverting input port and a non-inverting input port) and a single output port as shown. The input and output ports of comparators 20 and 30 are designated by reference numerals 22,24,26, and 32,34,36, respectively, as shown in FIG. 1. Operational amplifiers are known, therefore their principles of operation are not presented in detail herein. Comparators 20 and 30 are coupled to form, in accordance with the principles of the invention, a window comparator 108 which is utilized to frame the laser transmitter's normal range of operation. In this illustrative example, the normal operating range is defined as −8 to −15 dBm, inclusive. It is emphasized, however, that this operating range is chosen for illustrative purposes only, and should not be viewed as a limitation on the scope of the invention.

Figure 4:
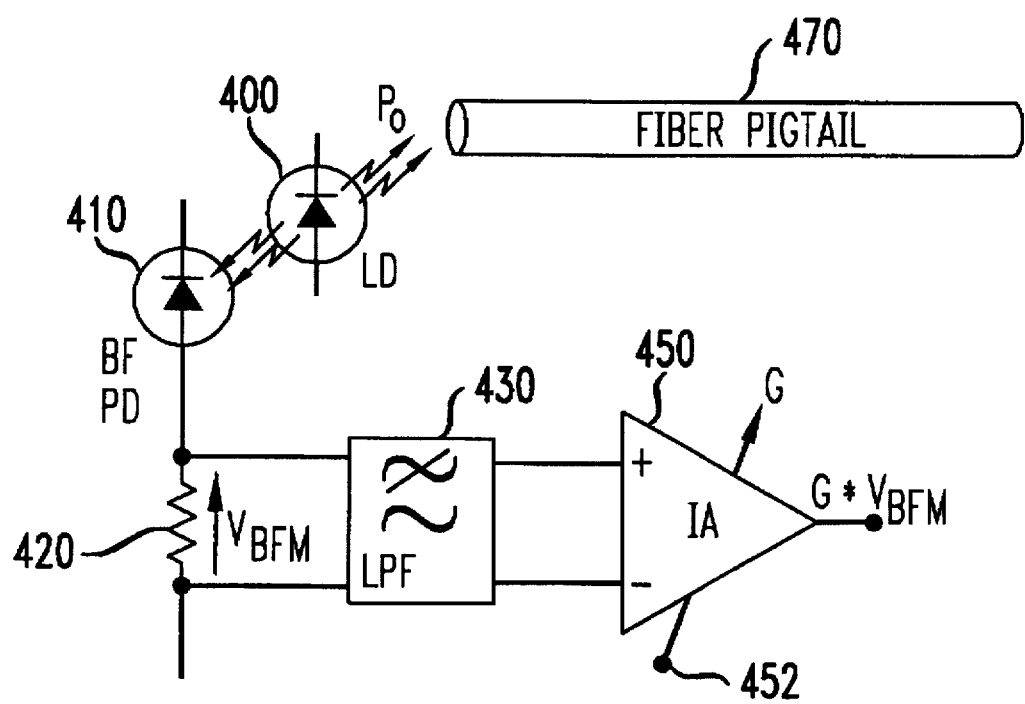
FIG 4 is a simplified diagram of an apparatus and circuit for generating a voltage signal which is indicative of a power output level of laser transmitter, in accordance with the invention.

The non-inverting input port 22 of comparator 20 and the inverting input port 32 of comparator 30 are coupled to receive, in parallel, a voltage signal $V_{laser}$ which is indicative of optical power output level (hereinafter referred to as output power level) of the laser transmitter. Such a voltage signal $V_{laser}$ may be generated in a variety of conventional ways. Alternatively, an example of a suitable apparatus and circuit for generating this signal is shown in FIG. 4 and discussed below.

The inverting input port 24 of comparator 20 is coupled to a fixed reference voltage $V_{ref}$. The value of $V_{ref}$ is selected to correspond to a voltage which is indicative of an upper threshold of the laser transmitter's specified normal operating range, that is $V_{ref}=V_{UT}$. Fixed reference voltage $V_{ref}$ may be supplied by any conventional voltage source. An output signal is generated by comparator 20 on output port 26 whenever the value of $V_{laser}$ exceeds the value of $V_{UT}$. Accordingly, $V_{ref}$ is set to correspond to an upper limit on the normal range of operation of the laser transmitter. The output signal on output port 26 is utilized as an alarm signal to indicate that the power output level of the laser transmitter has exceeded the upper threshold of its specified normal range of operation.

$V_{ref}$ is also coupled via line 110 to variable voltage source 50. Such coupling is provided because variable voltage source 50 provides a lower threshold signal $V_{LT}$, the voltage value of which is variably set as percentage of $V_{ref}$. That is, the value of $V_{LT}$ can generally be set anywhere within a range defined between zero and up to and including the value of $V_{ref}$. In this illustrative example, the range for $V_{LT}$ is typically between −8 and −15 dBm. It is recognized that it may be desirable in some applications of the invention to utilize other operating ranges, and further, to utilize a lower threshold signal $V_{LT}$ having a value that may exceed $V_{ref}$. In either case, the value of lower threshold signal $V_{LT}$ is varied in response to a control signal provided on line 120 from controller 40.

Figure 3:
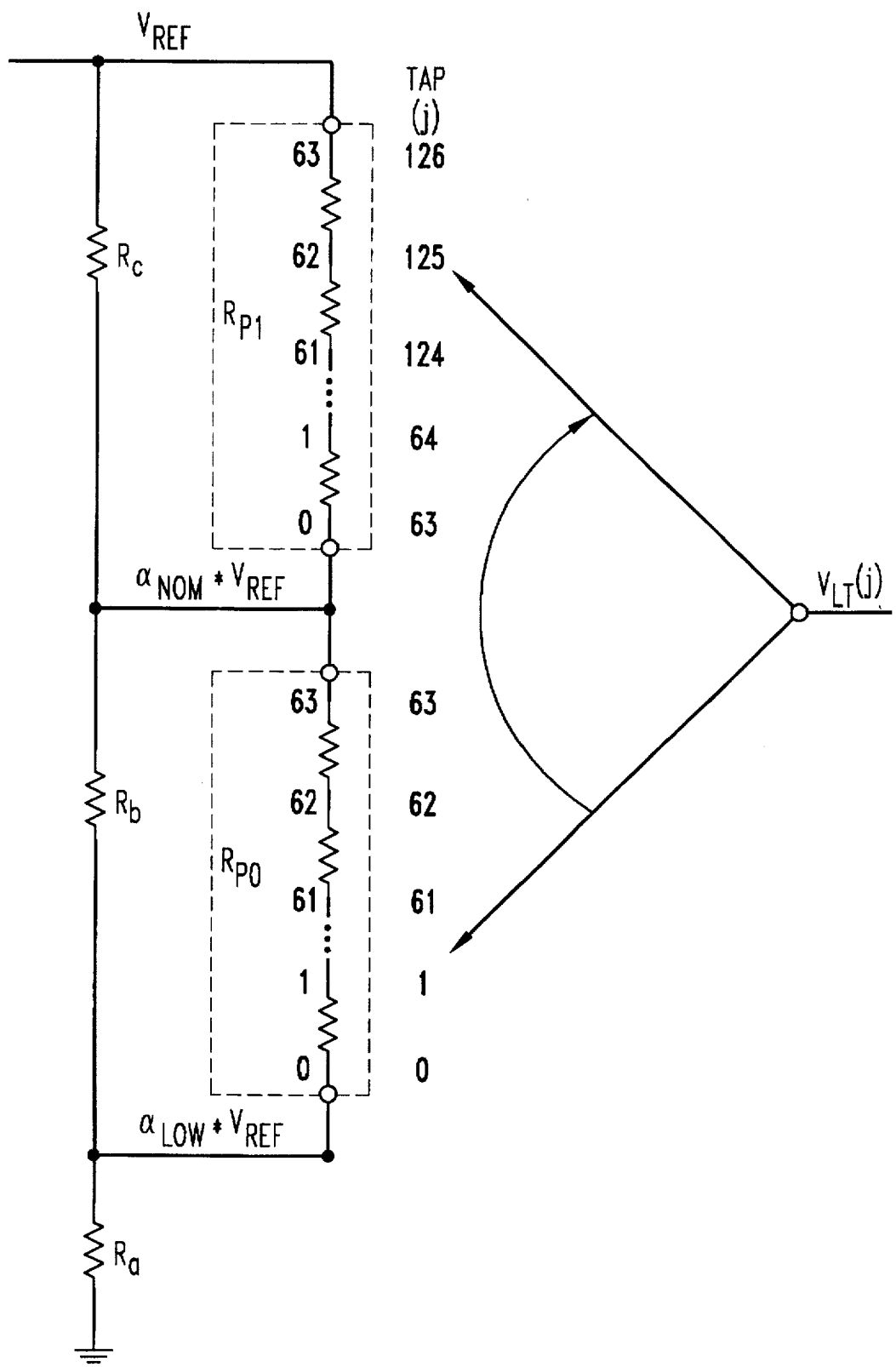
FIG. 3 is a simplified diagram of cascaded resistive arrays which may be used to implement an aspect of the invention.

Variable voltage sources are known. It is contemplated that any conventional controllable variable voltage source may be utilized to facilitate practice of the invention. However, one example of a preferred variable voltage source utilizes a digitally controllable potentiometer having a plurality of resistive arrays such as that produced by Xicor under the designation "Quad E$^2$POT." This particular digitally controlled potentiometer includes a wiper counter register for positioning the wiper on the resistor array and four 8-bit data registers. In a preferred embodiment of the invention utilizing the Xicor potentiometer, two such resistive arrays, each containing 63 discrete resistive segments, are cascaded to provide 127 taps allowing for fine control of the value of the lower threshold signal $V_{LT}$. This cascaded arrangement is illustrated in FIG. 3. Shown are taps 0–126 which are designated as TAP(j). FIG. 3 also shows the relationship between the lower threshold signal, indicated as $V_{LT}(j)$, reference voltage $V_{ref}$ and the attenuated reference voltages $\alpha_{Low}*V_{ref}$ and $\alpha_{NOM}*V_{ref}$. The two attenuation factors, $\alpha_{Low}$ and $\alpha_{NOM}$ are defined as $\alpha_{LOW}*V_{ref}=P_{min}$ and $V_{ref}=P_{max}$, thus, $$\alpha_{low} = \frac{P_{min}}{P_{max}} = -7dB = 0.1995 \quad (1)$$

where $P_{min}$ and $P_{max}$ as defined above, are −15 dBm and −8 dBm, respectively. The second attenuation factor $\alpha_{NOM}$ allows the cascaded resistive arrays to approximate a log-linear taper on a conventional potentiometer which may be desirable. $\alpha_{LOW}$ is related to $\alpha_{NOM}$ according to the following:

$$\alpha_{NOM} = \sqrt{\alpha_{low}} = \frac{-7dB}{2} = 0.4467 \quad (2)$$

The two attenuation factors $\alpha_{LOW}$ and $\alpha_{NOM}$ are used to establish the values of resistors $R_a$ and $R_b$. $R_c$ is chosen to reduce the effect of the large unit-to-unit variation in $R_{PI}$ according to the following relationships:

$$\alpha_{low} = \frac{R_a}{R_a + (R_b \| R_{PO} + (R_c \| R_{PI})} \quad (3)$$

and $$\alpha_{NOM} = \frac{R_a + (R_b \| R_{PO})}{R_a + (R_b \| R_{PO} + (R_c \| R_{PI})} \quad (4)$$

Those skilled in the art will appreciate that the use of some digitally controlled potentiometers may obviate the requirement for a separate controller in certain applications, particularly those potentiometers that incorporate significant control circuitry. In this illustrative example of the invention, a separate controller 40 is shown in order to facilitate a complete exposition of the principles of the invention. As digitally controlled potentiometers are known, and information concerning their operation widely available, no further details as to their use with the present invention are provided herein.

Referring back to FIG. 1, an output signal is generated by comparator 30 on output port 36 whenever the value of $V_{laser}$ falls below the value of $V_{LT}$. This output signal on output port 36 is coupled via line 130 to controller 40. The output signal on output port 36 is utilized as an alarm signal to indicate that the power output level of the laser transmitter has fallen below a variably-set lower threshold. In accordance with the principles of the invention, this variably-set lower threshold is switchable between at least two values. One of these two values corresponds to a predefined absolute lower threshold of the specified normal range of operation of the laser transmitter. If the output power level of the laser transmitter falls below this absolute lower threshold then an unacceptable level of bit-errors or other problems occur, and the laser transmitter is characterized as having failed. The other value corresponds to a predefined end-of-life threshold that is advantageously utilized to indicate that the laser transmitter is nearing the end of its useful life. Operation of the laser transmitter such that its output power level falls below this end-of-life threshold does not result in degraded performance, for example, an unacceptable bit-error rate. However, once the output power level falls to this predefined end-of-life threshold, it may be expected that certain key parameters of the laser transmitter, for example, extinction ratio, have degraded to a point that unacceptable laser transmitter performance will occur with continued operation. Advantageously then, maintenance personnel can schedule a laser transmitter replacement, or switch it out of service, prior to failure in order to minimize communication service disruption. For example, upon receiving the alarm signal which indicates operation at the end-of-life threshold, arrangements can be made for redundant or back-up transmitters to be employed, or laser transmitter replacement can be effectuated during off-peak hours of system operation.

As discussed above, in this example, the defined normal operating range of the laser transmitter is −8 to −15 dBm. Further assuming a nominal laser transmitter output power level of −11.5 dBm at room temperature (a value which is approximately centered in the given range), then the upper threshold signal $V_{UT}$ and $V_{REF}$ are set to a voltage which corresponds to −8 dBm. A 1 dB drop in laser transmitter output power, which corresponds to an operating state that is approximately 79% of the nominal output power, is considered, in this illustrative example, as an indication that the laser transmitter is nearing the end of its useful life. Accordingly, the value of lower threshold signal $V_{LT}$ is initially set to voltage that corresponds to one which 1 dB down from the nominal operating output power level. This value, −12.5 dBm, is thus the end-of-life threshold value. As described above, $V_{LT}$ is generated by variable voltage source 50. Accordingly, variable voltage source 50 is initially set to operate in a state where it provides a first $V_{LT}$ value corresponding to the end-of-life threshold value. This first operation state of variable voltage source 50 may be set, for example, in response to a control signal generated by controller 40 which is received by variable voltage source 50 on line 120.

As the laser transmitter operates, its bias current may be conventionally adjusted to generate the desired fixed optical power level. However, at some point a bias current limit will be reached. Typically, this limit is twice the initial current value. After the bias current limit is reached, the passage of time and additional temperature fluctuations will cause the power output level of the laser transmitter to decrease which results in a corresponding decrease in the value of $V_{laser}$. As discussed above, once the value of $V_{laser}$ becomes less than or equal to the value of $V_{LT}$, a first alarm signal is generated by comparator 30 on output port 36. This first alarm signal is utilized to indicate that the laser transmitter has reached the end of its useful life. Controller 40 receives this first alarm signal via line 130 which then switches variable voltage source 50 to a second state of operation. In this second state of operation, variable voltage source 50 generates a second $V_{LT}$ value corresponding to the absolute lower threshold of the specified normal operating range of the laser transmitter. That is, $V_{LT}$ is set (i.e., switched) from its initialized first value to the second value. Since this second value of $V_{LT}$ is less than the value of $V_{laser}$ at this time, the output of comparator 30 becomes inactive. As the output power level of the laser transmitter continues to degrade, the value of $V_{laser}$ will eventually fall below the second $V_{LT}$ value corresponding to the absolute lower threshold. Comparator 30 then generates a second alarm signal on output port 36 to indicate that the laser transmitter has failed.

Figure 2:
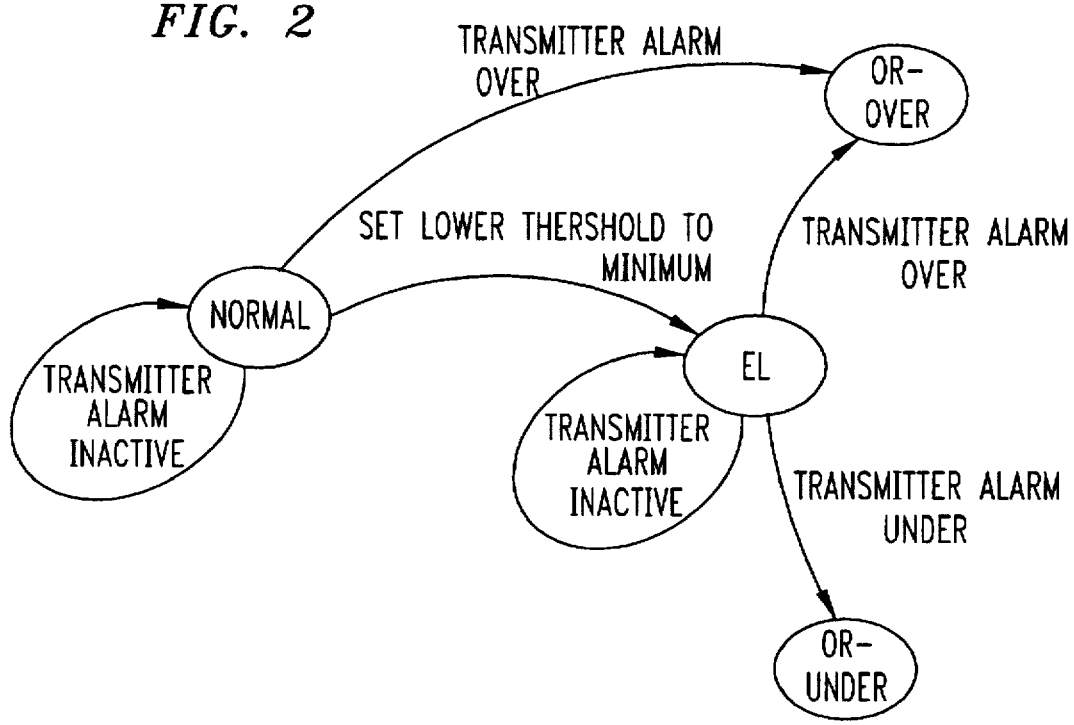
FIG. 2 is a state diagram used to highlight aspects of the illustrative laser monitor shown in FIG. 1.

FIG. 2 is a state diagram which is useful to highlight the inventive concepts discussed above. The state diagram of FIG. 2 indicates the states (i.e., the output level) of the laser transmitter monitored by laser monitor 100. As shown, laser monitor 100, in accordance with the principles of the invention, provides an indication as to which one of four states the laser transmitter is operating at a given time. These states are: Normal; End-of-life (designated "EL" in FIG. 2); Out-of-range-over ("OR-Over"); and, Out-of-range-under ("OR-Under"). In the normal state, neither comparator 20 or 30 has an active output port, that is, no transmitter alarm signal is generated. If the value of $V_{laser}$ exceeds the value of $V_{UT}$ (and $V_{ref}$), then comparator 26 generates a transmitter alarm signal indicating that the laser transmitter has moved from operating in the Normal state to operating in the OR-Over state. Alternatively, if the value of $V_{laser}$ falls below the first value of $V_{LT}$, then the laser transmitter has moved from operating in the Normal state to operating in the EL state. As discussed above, controller 40 switches variable voltage source 50 to provide a second $V_{LT}$ value corresponding to the absolute lower threshold so that the output port of comparator 30 becomes inactive, and the transmitter alarm signal becomes inactive. As shown in FIG. 2, it is possible to move from the EL state to either the OR-Over or OR-Under state as warranted by the value of $V_{laser}$.

Referring back to FIG. 1, output ports 26 and 36 of comparators 20 and 30, respectively, are coupled to multiplexer 70. Multiplexer 70 allows selection of a specific signal to be output from multiplexer output port 73, if desired. Accordingly, the use of multiplexer 70 should be considered optional. Multiplexer 70 switches its output port 73 among its four input ports 72, 74, 76, and 79, in response to a multiplexer control signal which is input to multiplexer control port 78. Controller 40, in this illustrative example, is coupled to send the multiplexer control signal to multiplexer control port 78 of multiplexer 70 via line 140. Alternatively, port 142 may be utilized to switch multiplexer 70 in response to a control signal generated by control circuits or devices (not shown) that are located remotely from laser monitor 100. Input port 72 is coupled to receive the alarm signal from comparator 20 which indicates the OR-Over state of the laser transmitter. Input port 76 is coupled to receive the alarm signal from comparator 30 which corresponds to the OR-Under state. Input port 79 is coupled to receive an inhibit (i.e., a "null" signal) which is indicated as a "0" in FIG. 1. When input port 79 is switched to output port 73 of multiplexer 70, no output signal is generated. In some applications of the invention it may be desirable for maintenance or other personnel to be able to switch the alarm signal off once the laser transmitter state has been ascertained. Alternatively, it may be desirable in certain instances to simply not utilize the alarm features of the present invention. Input port 74 of multiplexer 70 is coupled to receive a signal which is output from OR gate 60. OR gate 60 produces an output signal when a signal is received on either of its input ports 62 and 64. OR gates are known and not described in any further detail herein. The use of OR gate 60 provides for an alarm signal whenever the laser transmitter is operating outside its normal operating range (i.e., when the laser transmitter is operating in either the OR-Over, or OR-Under state).

Controller 40 may be any conventional controller which is capable of performing the control of variable voltage source 50 as described above. Controller 40 may be, for example, assembled from known discrete components, or more preferably, be one of a variety of application-specific or general-purpose digital processors that are widely available. Alternatively, the functionality of controller 40 may be incorporated within other controllers or processors that may be utilized as part of the laser transmitter circuit card or circuit pack or that are located as part of the larger communication system.

FIG. 4 is a simplified diagram of an apparatus and circuit for generating a voltage signal which is indicative of a power output level of the laser transmitter, in accordance with the invention. Such apparatus and circuit would typically be integrated within a laser transmitter circuit card or circuit pack (not shown). Shown in FIG. 4 are laser diode 400, photo-detector 410, resistor 420, low-pass filter 430, and variable gain instrumentation amplifier 450. All of these elements are known. Laser diode 400, when supplied with bias current supplied from an external current source (not shown), lases such that coherent light passes from the laser diode's front face into fiber pigtail 470 and is transmitted to a remote receiver (not shown). Laser diode 400, or its optical output may be modulated using conventional modulation schemes, such that data is impressed on the laser output to form a high-frequency data stream. Photo-detector 410, which may, for example, be a photo-diode, is coupled to the back face of laser diode 400 such that it receives light emanating from the back face. Photo-detector 410, in this illustrative example, is a conventional square-law device which generates a current that is proportional to the optical power output of laser diode 400. This current is passed through resistor 420 to generate a back face monitor voltage ("$V_{BFM}$") as shown in FIG. 4.

Low pass filter 430 filters out the high-frequency components of $V_{BFM}$ that may be present as a result of the high frequency modulation of laser diode 400 or its optical output. It is emphasized that while such low pass filtering is very helpful in obtaining a low-noise indication of power output level of laser diode 400, such filtering should be considered optional, particularly in applications where high-frequency data modulation does not occur. The output of low pass filter 430 is coupled to the input ports of variable gain instrumentation amplifier 450. Variable gain instrumentation amplifier 450 may comprise a conventional operational amplifier, or more preferably comprise an electronically variable gain amplifier. In certain applications of the invention, it may be desirable to utilize the same digitally controlled potentiometer described above when referring to FIG. 3. to control the gain of variable gain instrumentation amplifier 450. Alternatively, the gain may be controlled by coupling the gain control to controller 40 (FIG. 1) via output port 42 (FIG. 1) and gain control input port 452.

Variable gain instrumentation amplifier 450 is utilized to compensate for the unit-to-unit variability of $V_{BFM}$ that may occur, due, for example, to normal production variations in laser diodes. Accordingly, variable gain instrumentation amplifier 450 is used to normalize $V_{BFM}$ to a fixed reference. This fixed reference, $V_{REF}$, as discussed above, is utilized to establish the upper threshold of the laser diodes's specified operating range. Moreover, the correlation to a fixed reference allows the output of variable gain instrumentation amplifier 450 to advantageously represent the absolute output power level of laser diode 400 so that average optical output power may be ascertained. Such normalization may be implemented, for example, by noting the optical power output from laser diode 400 when modulated with a test data bit-stream or pseudo-random bit-stream. The lower threshold $V_{LT}$ is then set to correspond to the measured optical power output. The gain setting of variable gain instrumentation amplifier 450 is then adjusted, using controller 40 (FIG. 1) or a digitally controlled potentiometer, as discussed above, until a change is detected by comparator 30 and an alarm signal indicative of the OR-Under state is generated. This gain setting process normalizes the amplified back face monitored voltage to the absolute power measure, thus correlating the comparator thresholds to absolute power. Thus, the output of variable gain instrumentation amplifier 450 on its output port, which is indicated by the product $G*V_{BFM}$, is utilized as a measurement of the optical power of laser diode 400. Specifically, a measurement of the optical power output may be made anytime the laser transmitter is in the normal or EL state. Referring back to FIG. 1, the lower threshold signal $V_{LT}$ is incrementally lowered until the alarm signal is generated by comparator 30 on output port 36. The corresponding variable voltage source or digitally controlled potentiometer setting then defines the output power. In the case of the preferred digitally controlled potentiometer, as illustrated in FIG. 3, the equivalent optical output power is defined by:

$$P = 10\log\left[\alpha_{low} + \frac{j}{63}(\alpha_{nom} - \alpha_{low})\right] - 8\text{dBm} \quad 0 \leq j \leq 63 \quad (5)$$

and

-continued $$P = 10\log\left[\alpha_{nom} + \frac{j-63}{63}(1-\alpha_{nom})\right] - 8\text{dBm} \quad 64 \leq j \leq 126 \quad (6)$$

where $\alpha_{low}$ and $\alpha_{NOM}$ are expressed as a ratio, not in dB.

The gain setting of variable gain instrumentation amplifier 450 may be stored in a memory 90, for example, a non-volatile memory, which may be optionally coupled to controller 40 as shown in FIG. 1. Those skilled in the art will recognize that output from $G*V_{BFM}$ from variable gain instrumentation amplifier 450 may be advantageously utilized as the $V_{laser}$ input to the window comparator 108 in FIG. 1.

Memory 90 may also be optionally utilized to store periodically sampled output power levels of the laser transmitter utilizing the above-described measurement process. These stored samples may be used to communicated a history of laser transmitter performance. Known curve-fitting algorithms may also be utilized with such samples in order to predict end-of-life and failed states prior to their occurrence.

The above-described arrangements are, of course, merely illustrative of the application of the principles of the invention. Other arrangements may be devised by those skilled in the art without departing from the spirit or scope of the invention. It is accordingly desired that the scope of the appended claims not be limited to the specific disclosure herein contained.

The invention claimed is:

1. An apparatus for use in monitoring an output level of a laser comprising:
   a controllably variable voltage source having at least two operational states, during a first of the operational states the voltage source supplies as an output a first threshold voltage value and during a second of the operational states the voltage source supplies as an output a second threshold voltage value lower in value than the first threshold voltage value;
   a window comparator supplied with the output of the voltage source and being adapted to be supplied with a signal representative of the output level of the laser and further being adapted to generate as an output a first alarm signal when the laser output level is equal to or less than the first threshold voltage value; and
   a controller being responsive to the first alarm signal to control switching the voltage source from the first operational state to the second operational state so that the second threshold voltage value is supplied as an output from the voltage source.

2. The apparatus of claim 1 wherein said first threshold value corresponds to an end-of-life operating state of said laser.

3. The apparatus of claim 1 wherein said window comparator generates a second alarm signal when said signal representative of said laser output level has a value equal to or less than said second threshold value.

4. The apparatus of claim 3 wherein said second threshold value corresponds to a failed operating state of said laser.

5. The apparatus of claim 4 further including a storage device connected in circuit with said controller to store a performance history of said laser output level.

6. The apparatus of claim 1 wherein said window comparator comprises a first comparator and a second comparator, wherein said first comparator and said second comparator are connected in a predetermined circuit relationship.

7. The apparatus of claim 6 further including an OR gate having a first input port, a second input port and an output port, an output from said first comparator being supplied to said first input port of said OR gate and an output from said second comparator being supplied to said second input port of said OR gate, an out-of-range signal being generated at the OR gate output port when an alarm signal is supplied to either of said first input port of said OR gate or said second input port of said OR gate.

8. The apparatus of claim 7 further including a multiplexer having a plurality of input ports and a single output port, a first of said multiplexer input ports being supplied with a signal from the output port of said OR gate, a second of the multiplexer input ports and a third of the multiplexer input ports being in circuit relationship with said window comparator, wherein said multiplexer selectably switches signals supplied to said multiplexer inputs to the single output of the multiplexer.

9. The apparatus of claim 1 further including a source of a fixed reference voltage which is supplied as a third threshold voltage value to said first comparator of said window comparator.

10. The apparatus of claim 9 wherein said window comparator supplies as an output a third alarm signal when said signal representative of said laser output level has a value equal to or larger than said third threshold voltage value.

11. The apparatus of claim 9 wherein said third threshold value corresponds to an operational state wherein said laser output level has exceeded a normal upper limit of operation.

12. A method for monitoring an output level of a laser, the method comprising the steps of:

selectively generating at least first threshold voltage and second threshold voltage values;

setting a threshold voltage value to a first of the at least first and second threshold voltage values, said first threshold voltage value representing a first operational output state of said laser, and said second threshold voltage value representing a second operational output state of said laser;

generating an output signal representative of said output level of said laser;

comparing a value of said output signal representative of said output level with said first threshold voltage value; and selectively generating said second threshold voltage value when said value of said output signal representative of said output level of said laser is less than or equal to said first threshold voltage value.

13. The method of claim 12 further including a step of generating a first alarm signal when said value of said output signal representative of said output power level is less than or equal to said first threshold voltage value.

14. The method of claim 12 further including a step of comparing a value of said output signal representative of said output power level with said second threshold voltage value.

15. The method of claim 14 further including a step of generating a second alarm signal when said value of said output signal representative of said output power level is less than or equal to said second threshold voltage value.

16. The method of claim 12 further including the steps of supplying a third threshold voltage value representing a third output operational state of said laser, and comparing a value of said output signal representative of said output level with said third threshold voltage value, and generating a third alarm signal when said value of said output level is greater than or equal to said third threshold value.

17. An apparatus for use in monitoring an optical output power level of a laser, comprising a photodiode adapted to receive laser light from said laser to generate an electrical current which is proportional to the optical output power level of said laser;

a resistor in series circuit relationship with the photodiode and being supplied with the electrical current to generate a monitor voltage;

a window comparator having a plurality of input ports and a plurality of output ports, said monitor voltage being supplied to two of said input ports, wherein the window comparator compares said monitor voltage to a threshold voltage value supplied from a variable voltage source to a third input port, and supplying as an output an alarm signal in response to said comparison; and a variable voltage source having an output in circuit with said third input port and being responsive to an output from the window comparator to supply a plurality of threshold voltage values to said third input port of said window comparator.

18. The apparatus of claim 17 further including a variable gain amplifier in circuit between said resistor and said window comparator.

19. The apparatus of claim 18 further including a low pass filter in circuit between said resistor and said variable gain amplifier for removing high-frequency components from said monitor voltage.

20. The apparatus of claim 17 further including a controller supplied with an output of said window comparator, and further being in circuit relationship with said variable voltage source to controllably switch said variable voltage source between supplying a first of said threshold voltage values to supplying a second of said threshold voltage values in response to said alarm signal received from said window comparator.

21. The apparatus of claim 20 wherein said controller is further in circuit relationship with said variable gain amplifier and controls the gain of said variable gain amplifier.

22. The apparatus of claim 20 wherein said first threshold voltage value corresponds to an end-of-life operational state of said laser.

23. The apparatus of claim 20 wherein said second threshold voltage value corresponds to a failed operational state of said laser.

24. The apparatus of claim 17 further including a source of a fixed voltage value in circuit relationship with a fourth input port of said window comparator to supply a third threshold voltage value to said window comparator.

25. The apparatus of claim 24 wherein said window comparator compares said monitor voltage to said third threshold voltage value and supplies as an output an alarm signal in response to said comparison.

* * * * *